(12) United States Patent
Kim

(10) Patent No.: US 7,839,006 B2
(45) Date of Patent: Nov. 23, 2010

(54) SEMICONDUCTOR DEVICE AND METHOD FOR MANUFACTURING THE SAME

(75) Inventor: Yung Pil Kim, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/458,682

(22) Filed: Jul. 20, 2009

(65) Prior Publication Data

US 2010/0019353 A1    Jan. 28, 2010

Related U.S. Application Data

(62) Division of application No. 11/312,595, filed on Dec. 21, 2005, now Pat. No. 7,575,980.

(30) Foreign Application Priority Data

Dec. 29, 2004    (KR)    ...................... 10-2004-0114798

(51) Int. Cl.
*H01L 21/76*    (2006.01)
(52) U.S. Cl. .............................. 257/797; 257/E23.179; 438/401
(58) Field of Classification Search ................. 438/462; 257/797
See application file for complete search history.

(56) References Cited

PUBLICATIONS

Wolf, S., "Silicon Processing for the VLSI Era", Vo.l. 2: Process Integration, 1990, pp. 273-274.

*Primary Examiner*—Matthew C Landau
*Assistant Examiner*—Sonya D McCall-Shepard
(74) *Attorney, Agent, or Firm*—McKenna Long & Aldridge LLP

(57) ABSTRACT

A semiconductor device and a method for manufacturing the same prevents copper from being exposed to a surface of a passivation film after a copper metal line formation, to avoid contamination of processing equipment and the process environment. The method includes providing a substrate with a scribe lane and a chip area in which metal wiring layers are formed, forming a dielectric film, forming a conductive film on the dielectric film in a chip area and an alignment mark on the dielectric film in a scribe lane, forming passivation films, exposing the conductive film by removing the passivation films in a bonding pad portion in a chip area, forming another conductive film in the bonding pad portion to electrically connect with the conductive film, forming another passivation film, and selectively removing the passivation films.

4 Claims, 8 Drawing Sheets

SEMICONDUCTOR DEVICE AND METHOD FOR MANUFACTURING THE SAME

This application is a divisional of, and claims benefit of, application Ser. No. 11/312,595, filed Dec. 21, 2005 now U.S. Pat. No. 7,575,980, and claims priority to Korean Patent Application Nos. 10-2004-0114798, filed on Dec. 29, 2004, both of which are hereby incorporated by reference for all purposes as if fully set forth herein.

BACKGROUND OF THE INVENTION

1. Field of the Invention

The present invention relates to semiconductor devices, and more particularly, to a semiconductor device and a method for manufacturing the same in which copper is prevented from being exposed to a surface of a passivation film after a Cu metal line formation, to avoid contaminating equipment or the process environment.

2. Discussion of the Related Art

With more highly integrated semiconductor devices, the parasitic capacitance of a dielectric film and the resistance of a metal line both increase. Increased parasitic capacitance and resistance together slow the operational speed of a device. Therefore, there has been a trend toward the use of lower-k dielectrics as an interlayer dielectric film and the use of copper, which has low resistance, for metal lines. For bonding pads, however, aluminum is typically deposited on a copper wiring layer, since copper is a poor alloy with gold and is thus unsuitable for bonding pad formation. Such a process requires two separate passivation steps, whereby a passivation film is formed to prevent water penetration or corrosion during processing. Therefore, each passivation film must be without defects such as cracking and lifting. For example, defects in the passivation film may occur due to stresses generated when of scribing the wafer to render a plurality of devices or chips. Scribing typically uses an alignment key formed of fine copper patterns positioned in a scribe lane.

In a process of passivation film formation, a passivation film of a scribe lane is removed to guard against defects caused by such stressing. However, the copper lines of the alignment key are exposed, leading to potential contamination of equipment or the process environment during subsequent processing.

FIGS. 1A-1E respectively illustrate a method for manufacturing a semiconductor device according to a related art. As shown in each drawing, a semiconductor substrate is provided with a chip area (left side) and a scribe lane (right side). In the chip area, each of a plurality of metal wiring layers may be formed on a corresponding number of dielectric films. In FIGS. 1A-1E, the final layer of dielectric and metal line formation is depicted.

As shown in FIG. 1A, a dielectric film 1 is finally deposited on a semiconductor substrate (not shown) in which a number of metal wiring layers are formed using, for example, a damascene process. A first conductive film 2 is formed in the chip area over the last of the dielectric layers. Thus, the first conductive film 2 represents the final or uppermost metal wiring layer. Then, a first passivation film 3 is deposited on an entire surface of the substrate including the first conductive film 2.

Then, an alignment mark 5, which is a very fine pattern for aligning a wafer during processing, is formed in the scribe lane. The conductive film 2 and the alignment mark 5 are both formed of copper.

As shown in FIG. 1B, a first photoresist 4 is deposited on the first passivation film 3 and is patterned by a predetermined photolithography process. Using the first photoresist 4 as a mask, the first passivation film 3 is etched in the chip area to expose a portion, such as a bonding pad area, of the first conductive film 2 and is etched in the scribe lane to expose the alignment mark 5.

As shown in FIG. 1C, after the first photoresist 4 is removed, a second conductive film 6 is deposited on the entire surface and patterned by photolithographic and etching processes to remain on the portion, such as the bonding pad area. The second conductive film 6 is formed of aluminum.

As shown in FIG. 1D, a second passivation film 7 is deposited on the entire surface of the substrate including the second conductive film 6. A second photoresist 8 is deposited on the second passivation film 7 and patterned by photolithography to expose a bonding pad area and the scribe lane.

As shown in FIG. 1E, the second passivation film 7 is selectively etched using the second photoresist 8 as a mask to expose a portion of the second conductive film 6. The second photoresist 8 is then removed. The alignment mark 5 in the scribe lane is also exposed.

When a chip is finally cut, i.e., after completing an entire process of manufacturing a semiconductor device, a passivation film in a scribe lane is removed so as not to generate a defect caused by stress in the passivation film. A copper alignment mark, exposed as a result of the removal of the passivation film in the scribe lane, may contaminate equipment or cause fatal defects, as shown in FIG. 2.

SUMMARY OF THE INVENTION

Accordingly, the present invention is directed to a semiconductor device and a method for manufacturing the same, which substantially obviate one or more of the problems due to limitations and disadvantages of the related art.

An advantage of the present invention is to provide a semiconductor device and a method for manufacturing the same, which prevents the exposure of an alignment mark formed of copper in a scribe lane, to avoid the contamination of processing equipment and the process environment.

Additional features and advantages of the invention will be set forth in the description which follows, and in part will be apparent from the description which follows, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, there is provided a semiconductor device including a semiconductor substrate having a scribe lane and a chip area in which a plurality of metal lines are formed, a dielectric film formed on the semiconductor substrate, a first conductive film formed on the dielectric film in the chip area, an alignment mark formed on the dielectric film in the scribe lane, a first passivation film formed on an entire surface of the semiconductor substrate excluding the first conductive film, a second passivation film formed on the semiconductor substrate in the chip area excluding the scribe lane and the first conductive film, a second conductive film formed on the second passivation film and electrically connected with the first conductive film, and a third passivation film formed on the semiconductor substrate in the chip area excluding the scribe lane and the second conductive film.

In another aspect of the present invention, there is provided a method for manufacturing a semiconductor device including providing a semiconductor substrate with a scribe lane and a chip area in which a plurality of metal wiring layers are formed, forming a dielectric film on the semiconductor substrate, forming a first conductive film on the dielectric film in the chip area, forming an alignment mark on the dielectric film in the scribe lane, forming a first passivation film and a second passivation film on an entire surface of the semiconductor substrate excluding the first conductive film and the alignment mark, exposing the first conductive film by removing the first passivation film and the second passivation film corresponding to a portion for a bonding pad in the chip area, forming a second conductive film on the portion for the bonding pad to electrically connect with the first conductive film, forming a third passivation film on the entire surface of the semiconductor substrate including the second conductive film, selectively removing the third passivation film of the portion for the bonding pad, and selectively removing the second passivation film and the third passivation film in the scribe lane.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

FIGS. 3A-3E respectively illustrate a method for manufacturing a semiconductor device according to the present invention.

Figure 1A:
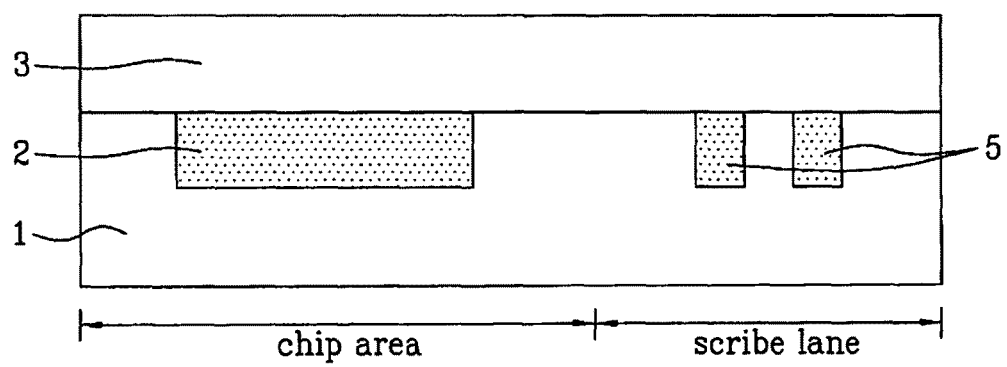
FIGS. 1A-1E are sectional views of a semiconductor device according to a related art process.
Figure 1B:
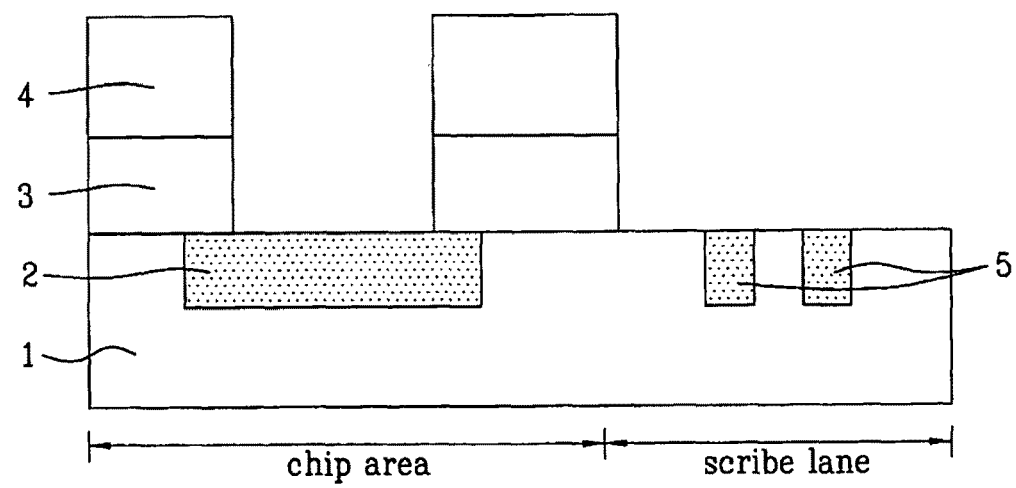
Figure 1C:
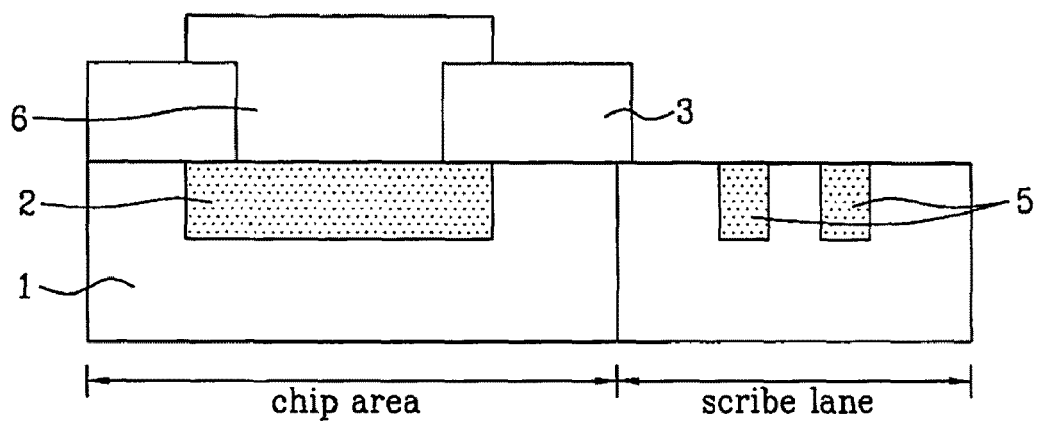
Figure 1D:
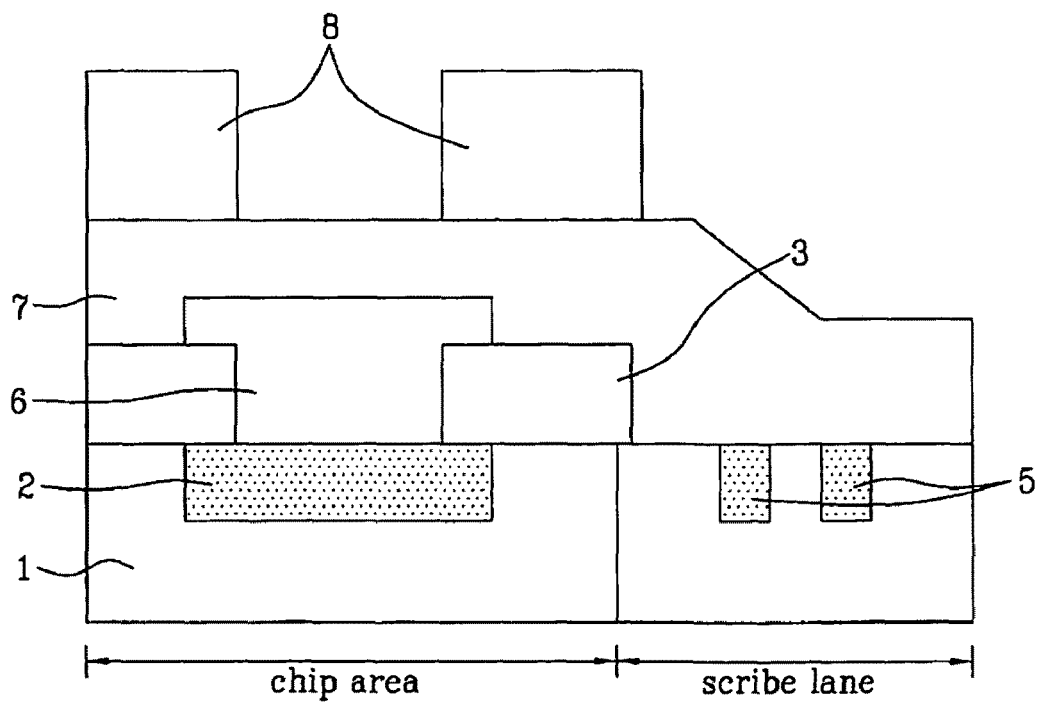
Figure 1E:
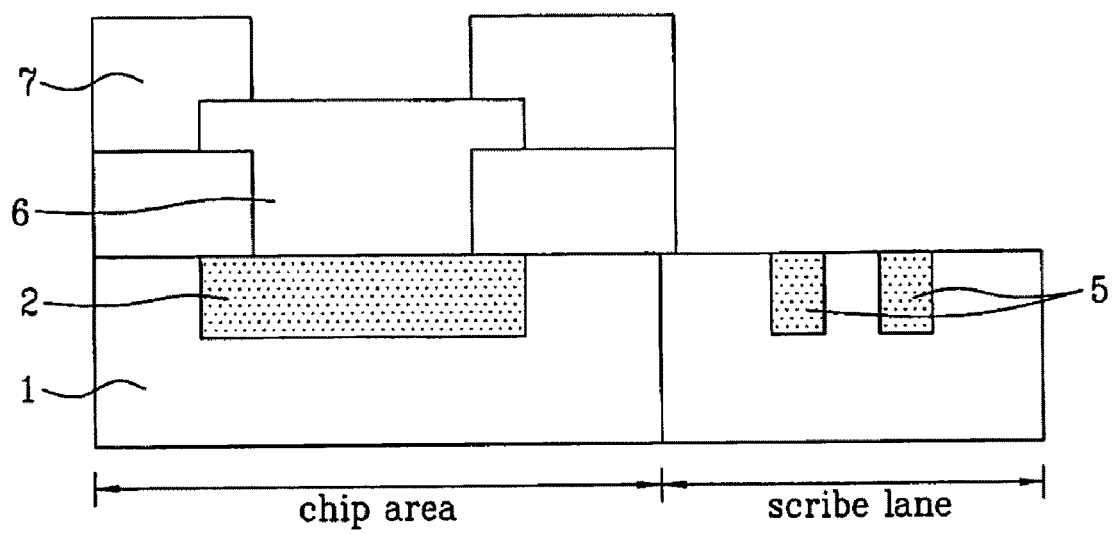
Figure 2:
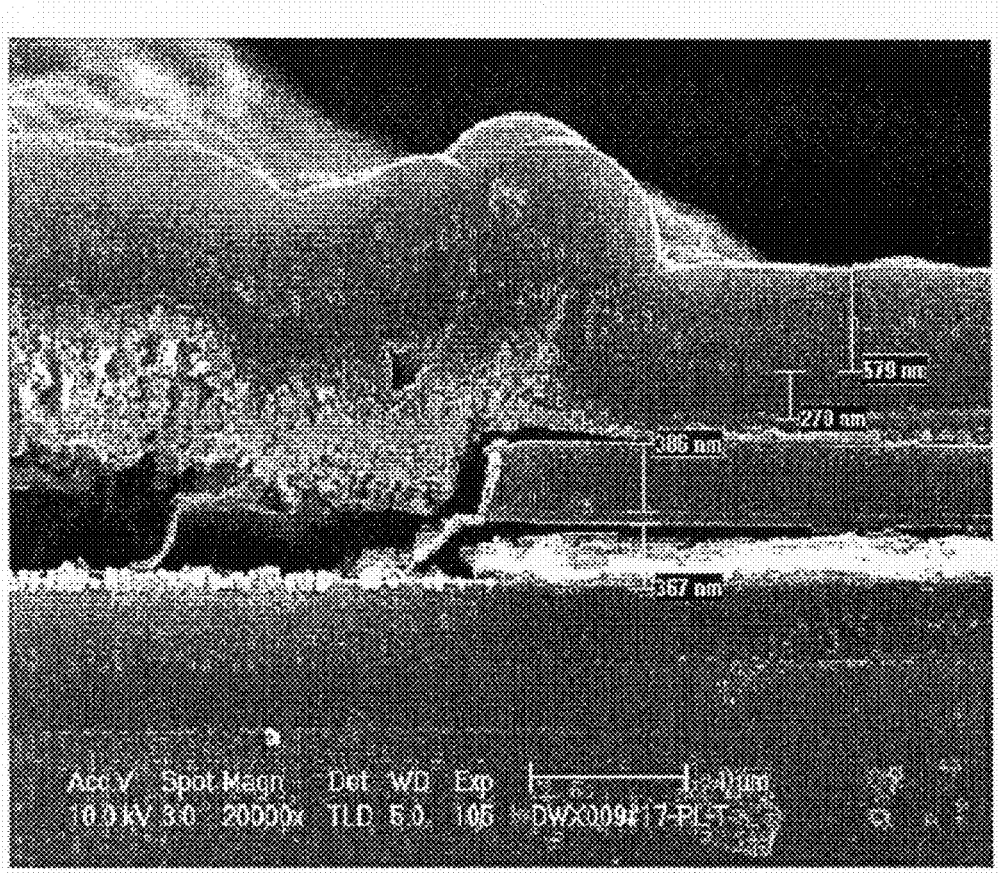
FIG. 2 is an SEM photograph of a section of a semiconductor device exhibiting problems caused by a related art process.
Figure 3A:
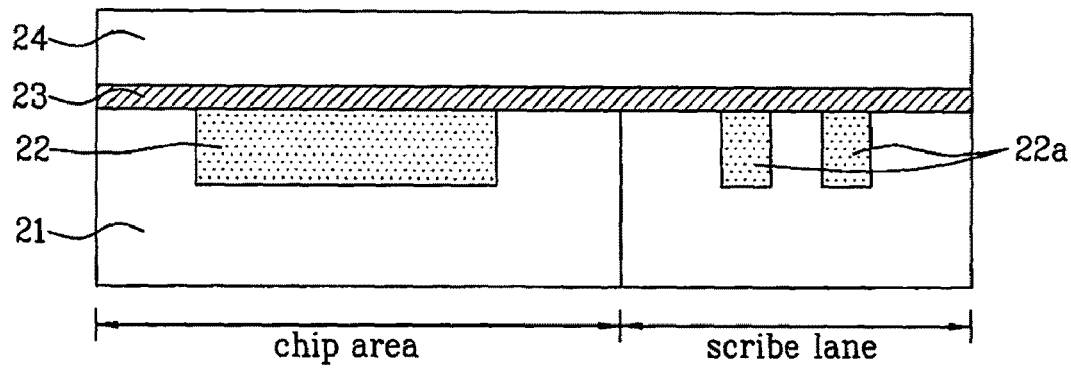
FIGS. 3A-3E are sectional views illustrating process steps of manufacturing a semiconductor device according to the present invention.

Referring to FIG. 3A, a dielectric film 21 is deposited on a semiconductor substrate (not shown), and a conductive film 22 is formed using a damascene process. An alignment mark 22a is formed in the scribe lane. The conductive film 22 and the alignment mark 22a may be both formed of copper. A first passivation film 23 and a second passivation film 24 are sequentially deposited on an entire surface of the substrate including the conductive film 22 and the alignment mark 22a. The first passivation film 23 and the second passivation film 24 may be formed of materials having differing etching selectivities. For example, the first passivation film 23 may be a silicon nitride film while the second passivation film 24 may be a tetra-ethyl-ortho-silicate oxide film.

Figure 3B:
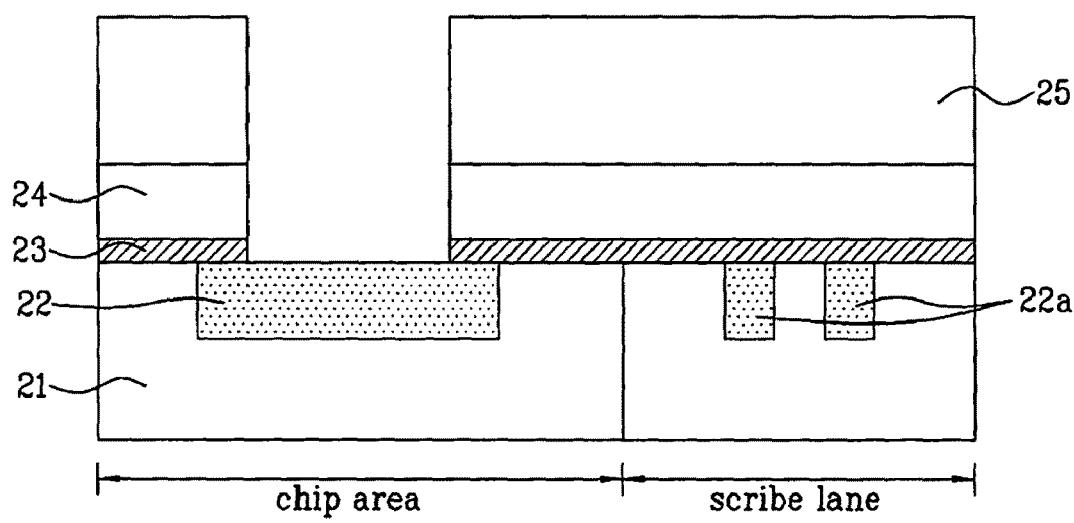

Referring to FIG. 3B, a first photoresist 25 is deposited on the second passivation film 24 and patterned by exposing and developing processes to open a portion for a bonding pad. The first and second passivation films 23 and 24 for the bonding pad portion are selectively removed using the patterned photoresist 25 as a mask. The first photoresist 25 remains in the scribe lane. Therefore, the alignment mark 22a of the scribe lane is not exposed, even if the first and second passivation films in the chip area are etched.

Figure 3C:
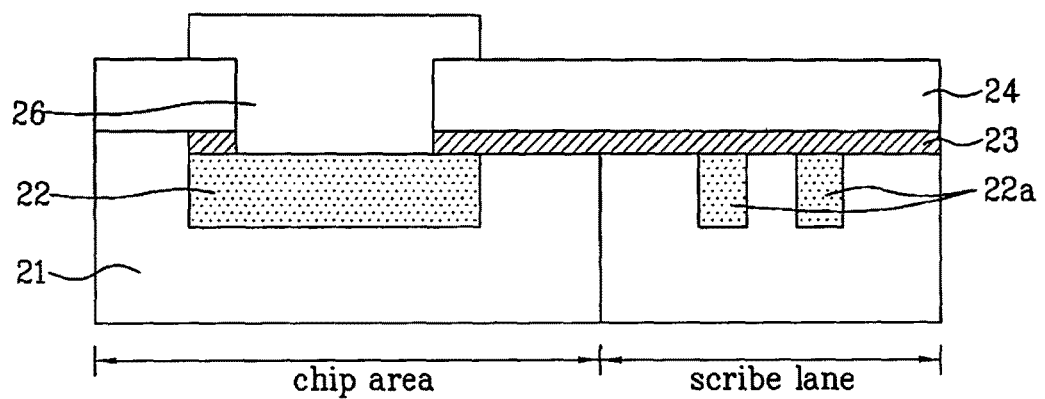

Referring to FIG. 3C, after the remaining photoresist 25 is removed, a second conductive film 26 is deposited on the entire surface of the semiconductor substrate and patterned by photolithographic and etching processes to remain only on the bonding pad portion. The second conductive film 26 may be formed of aluminum.

Figure 3D:
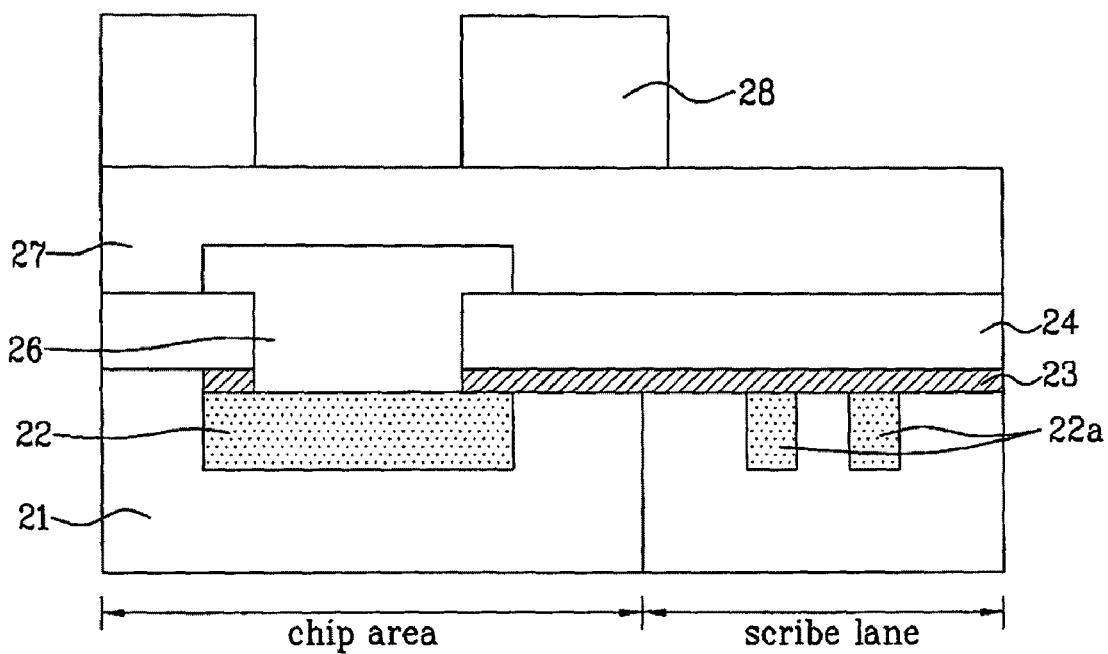

Referring to FIG. 3D, a third passivation film 27 is deposited on the entire surface of the substrate including the second conductive film 26. A second photoresist 28 is deposited on the third passivation film 27 and patterned by exposing and developing processes to open the portion for the bonding pad and the scribe lane.

Figure 3E:
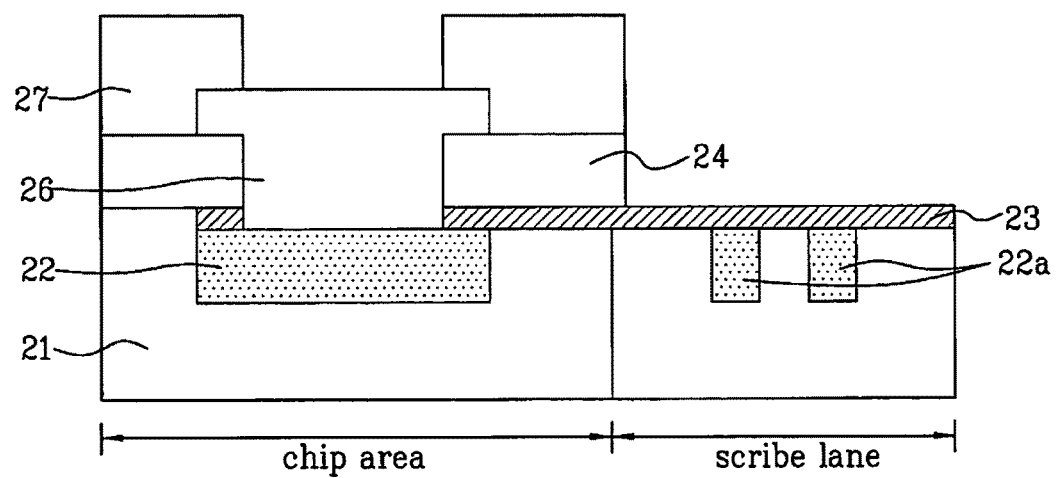

Referring to FIG. 3E, the third passivation film 27 is removed using the second photoresist 28 as a mask. An over etching process is performed to etch the third passivation film 27 and the second passivation film 24 on the scribe lane. However, the first passivation film 23 is not etched due to differences in etching selectivities between the first passivation film 23 and the second passivation film 24. Therefore, the alignment mark 22a in the scribe lane is not exposed.

Accordingly, a semiconductor device manufactured by the method of the present invention is shown in FIG. 3E. The device includes a semiconductor substrate (not shown) provided with a chip area and a scribe lane, in which a plurality of metal lines are formed, a dielectric film 21 formed on the semiconductor substrate, a first conductive film 22 formed on the dielectric film 21 in the chip area, an alignment mark 22a formed on the dielectric film 21 in the scribe lane, a first passivation film 23 formed on an entire surface of the semiconductor substrate excluding the first conductive film 22, a second passivation film 24 formed on the substrate in the chip area excluding the scribe lane and the first conductive film 22, a second conductive film 26 formed on the second passivation film 23 to electrically connect with the first conductive film 22, and a third passivation film 27 formed on the substrate in the chip area excluding the scribe lane and the second conductive film 26.

According to the present invention, the first, second, and third passivation films may have different etching selectivities, respectively, and may be formed based on their respective different etching selectivities. The second and third passivation films in the scribe lane are removed to prevent a defect caused by stress from occurring when a chip is finally scribed. In addition, since the first passivation film protects the alignment mark formed of copper, it is possible to prevent equipment from being contaminated and to prevent fatal defects from being generated, thereby improving yield.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
   a semiconductor substrate having a scribe lane and a chip area in which a plurality of metal lines are formed;
   a dielectric film formed on the semiconductor substrate;
   a first conductive film formed on the dielectric film in the chip area;

an alignment mark formed on the dielectric film in the scribe lane;

a first passivation film formed on an entire surface of the semiconductor substrate including the first conductive film in the chip area and the alignment mark in the scribe lane sequentially;

a second passivation film formed on the semiconductor substrate in the chip area excluding the scribe lane and the first conductive film;

a second conductive film formed on the second passivation film and electrically connected with the first conductive film through the first passivation film and the second passivation film in the chip area; and a third passivation film formed on the semiconductor substrate in the chip area excluding the scribe lane and the second conductive film, wherein the first passivation film and the second passivation film have different etch selectivity.

2. The semiconductor device of claim 1, wherein the first conductive film and the alignment mark are formed of copper.

3. The semiconductor device of claim 1, wherein the first passivation film is a silicon nitride film and the second passivation film is a tetra-ethyl-ortho-silicate oxide film.

4. The semiconductor device of claim 1, wherein the second conductive film is formed of aluminum.

* * * * *